(12) United States Patent
Lojek

(10) Patent No.: US 7,341,916 B2
(45) Date of Patent: Mar. 11, 2008

(54) SELF-ALIGNED NANOMETER-LEVEL TRANSISTOR DEFINED WITHOUT LITHOGRAPHY

(75) Inventor: Bohumil Lojek, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 254 days.

(21) Appl. No.: 11/271,094

(22) Filed: Nov. 10, 2005

(65) Prior Publication Data

US 2007/0102772 A1    May 10, 2007

(51) Int. Cl.
*H01L 21/336* (2006.01)

(52) U.S. Cl. .............................. 438/284; 257/E21.623; 257/E21.637; 257/E21.014

(58) Field of Classification Search ................ 438/157, 438/283, 158, 159, 176, 284; 257/E21.623, 257/E21.637, E21.014
See application file for complete search history.

(56) References Cited

U.S. PATENT DOCUMENTS

| | | | | |
|---|---|---|---|---|
| 5,578,513 | A * | 11/1996 | Maegawa ................... | 438/151 |
| 6,252,284 | B1 * | 6/2001 | Muller et al. ............... | 257/412 |
| 6,285,045 | B1 | 9/2001 | Itabashi et al. ............. | 257/211 |
| 6,413,802 | B1 * | 7/2002 | Hu et al. .................... | 438/151 |
| 6,483,156 | B1 * | 11/2002 | Adkisson et al. ........... | 257/401 |
| 6,620,674 | B1 | 9/2003 | Itabashi et al. ............. | 438/241 |
| 6,709,982 | B1 * | 3/2004 | Buynoski et al. ........... | 438/696 |
| 6,716,684 | B1 * | 4/2004 | Krivokapic et al. ........ | 438/157 |
| 6,750,487 | B2 * | 6/2004 | Fried et al. ................. | 257/270 |
| 6,858,478 | B2 * | 2/2005 | Chau et al. ................. | 438/149 |
| 6,864,164 | B1 * | 3/2005 | Dakshina-Murthy et al. ........................... | 438/585 |
| 6,972,233 | B2 * | 12/2005 | Kamins ....................... | 438/270 |
| 7,037,790 | B2 * | 5/2006 | Chang et al. ............... | 438/275 |
| 7,115,920 | B2 * | 10/2006 | Bernstein et al. ........... | 257/204 |
| 7,183,152 | B1 * | 2/2007 | Dakshina-Murthy et al. ........................... | 438/197 |
| 7,193,279 | B2 * | 3/2007 | Doyle et al. ................ | 257/401 |
| 7,253,060 | B2 * | 8/2007 | Yun et al. ................... | 438/284 |
| 7,265,059 | B2 * | 9/2007 | Rao et al. ................... | 438/734 |
| 7,265,418 | B2 * | 9/2007 | Yun et al. ................... | 257/347 |
| 7,276,763 | B2 * | 10/2007 | Yeo et al. ................... | 257/328 |
| 2004/0038464 | A1 * | 2/2004 | Fried et al. ................. | 438/151 |
| 2004/0075122 | A1 * | 4/2004 | Lin et al. .................... | 257/288 |
| 2004/0150029 | A1 * | 8/2004 | Lee ............................. | 257/308 |
| 2005/0020020 | A1 | 1/2005 | Collaert et al. ............. | 438/300 |
| 2005/0104096 | A1 * | 5/2005 | Lee et al. .................... | 257/288 |
| 2006/0029887 | A1 * | 2/2006 | Oh et al. ..................... | 430/311 |
| 2006/0216897 | A1 * | 9/2006 | Lee et al. .................... | 438/282 |
| 2006/0273415 | A1 * | 12/2006 | Kim ............................ | 257/413 |

* cited by examiner

*Primary Examiner*—Lex Malsawma
*Assistant Examiner*—Ankush K Singal
(74) *Attorney, Agent, or Firm*—Schneck & Schneck; Thomas Schneck

(57) ABSTRACT

A field effect transistor (FET) device structure and method for forming FETs for scaled semiconductor devices. Specifically, FinFET devices are fabricated from silicon-on-insulator (SOI) wafers in a highly uniform and reproducible manner. The method facilitates formation of FinFET devices with improved and reproducible fin height control while providing isolation between source and drain regions of the FinFET device.

17 Claims, 10 Drawing Sheets

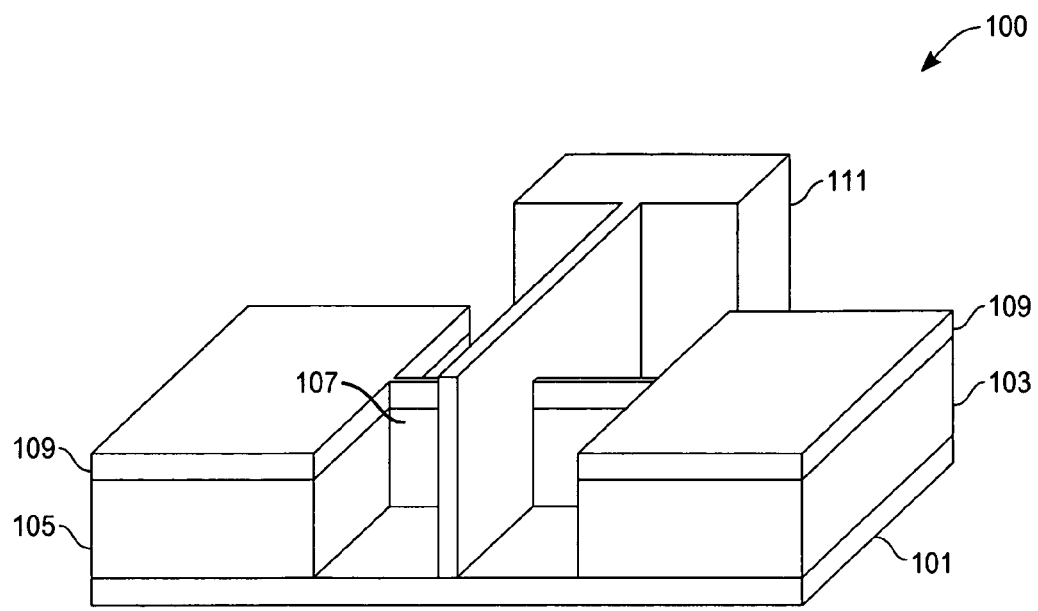
Fig._ 1 (Prior Art)
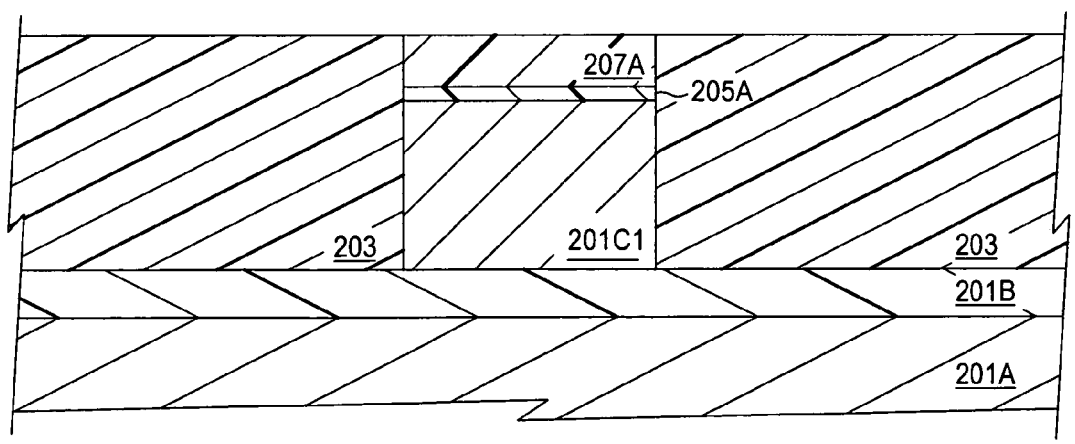
Fig._ 2A

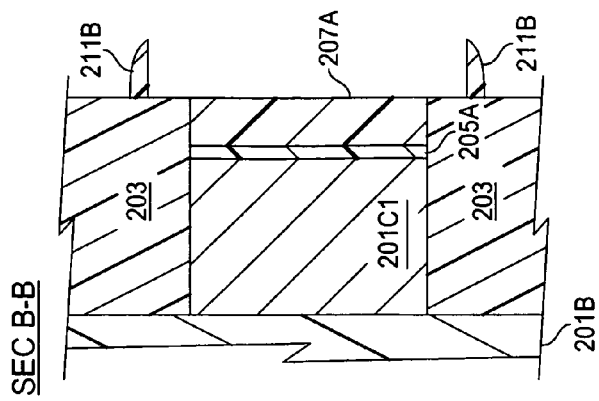
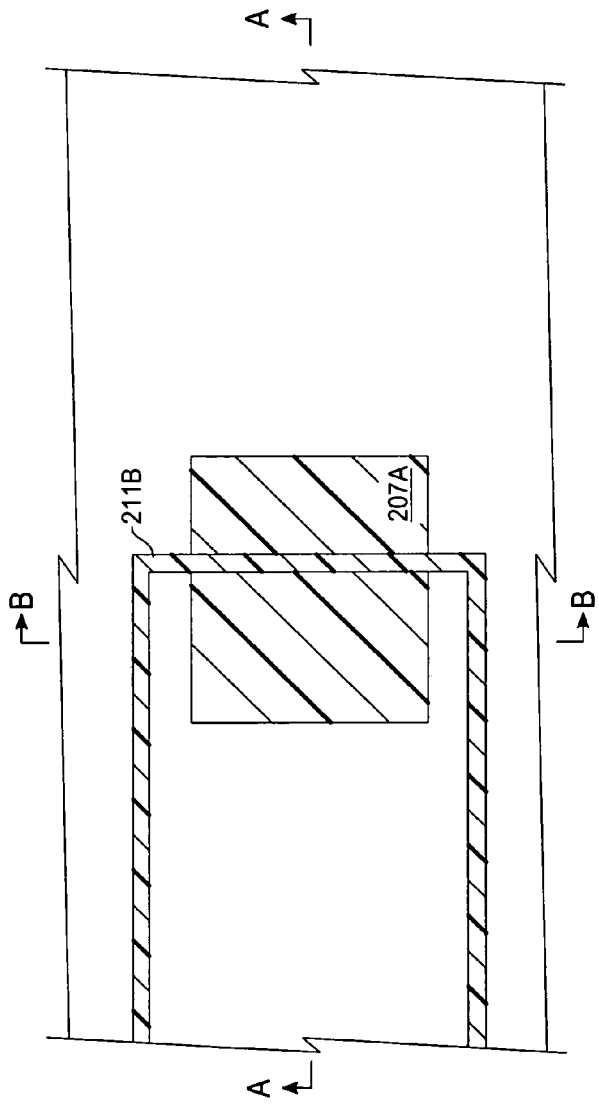
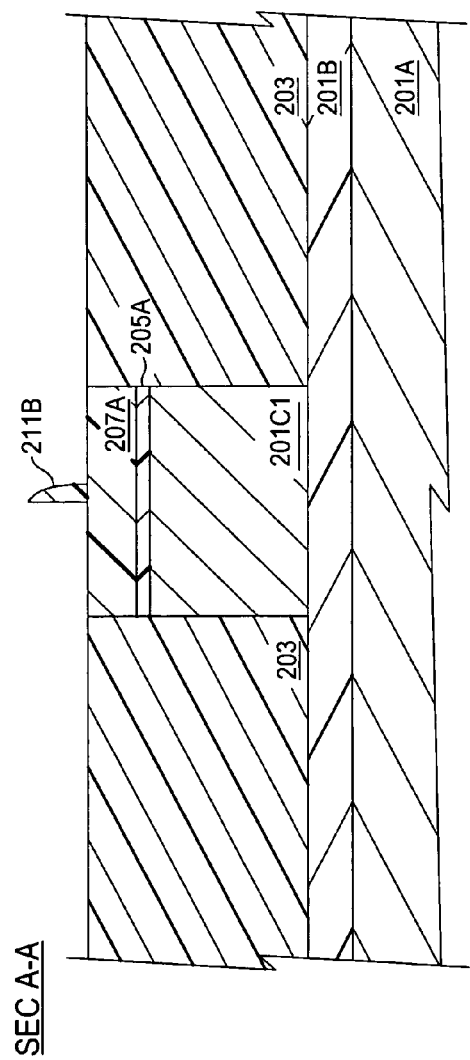
Fig. 2F

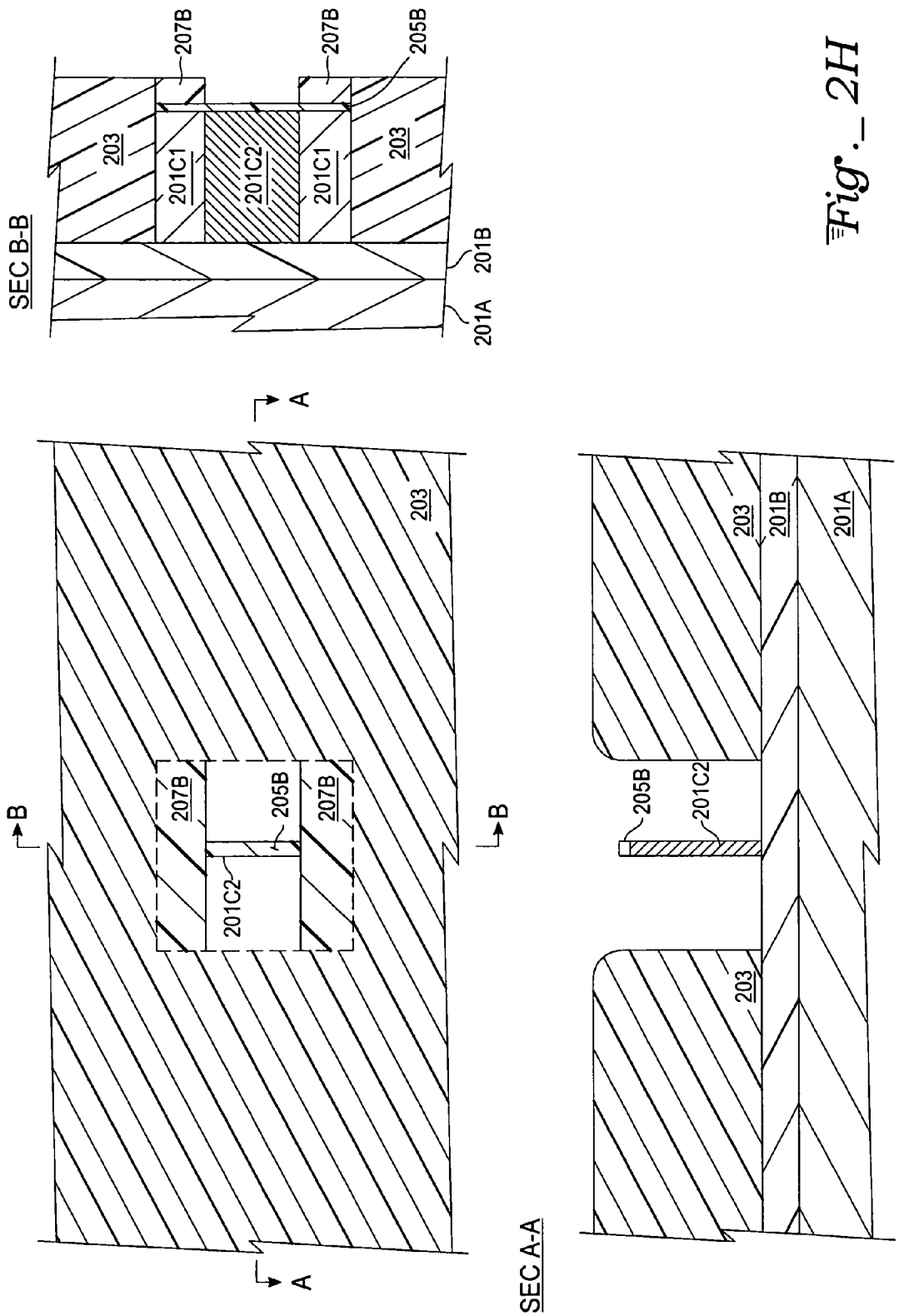
Fig._2H

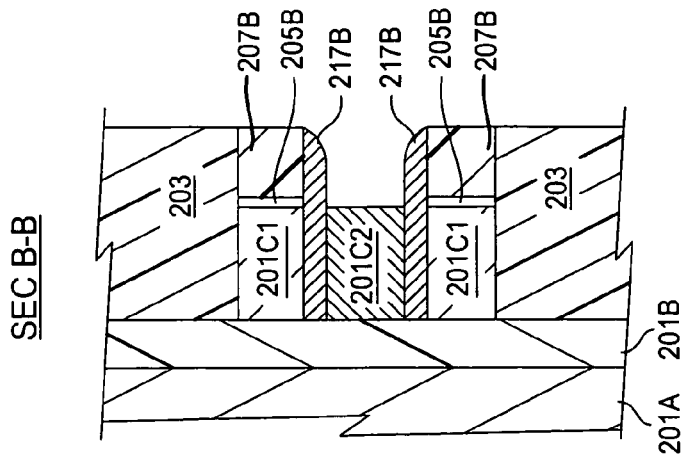
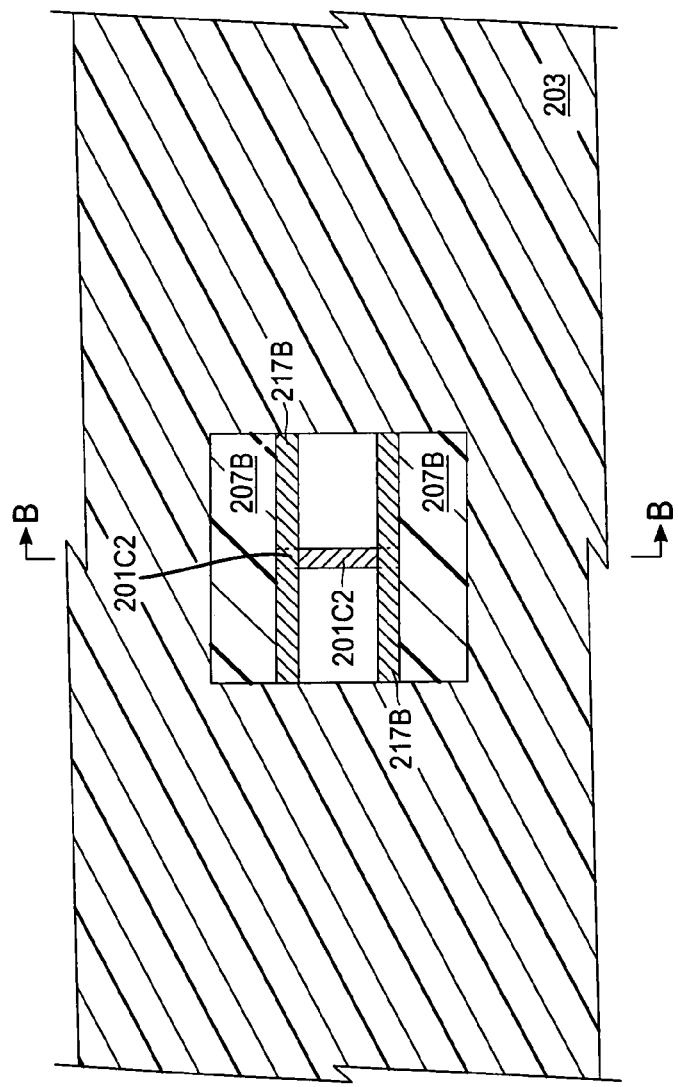
Fig. 2J

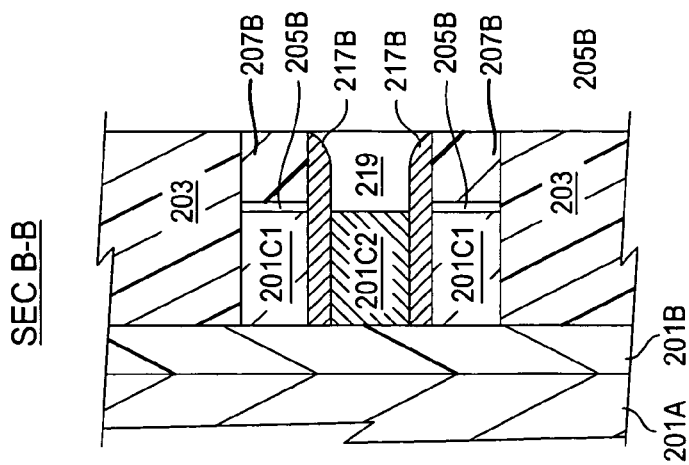
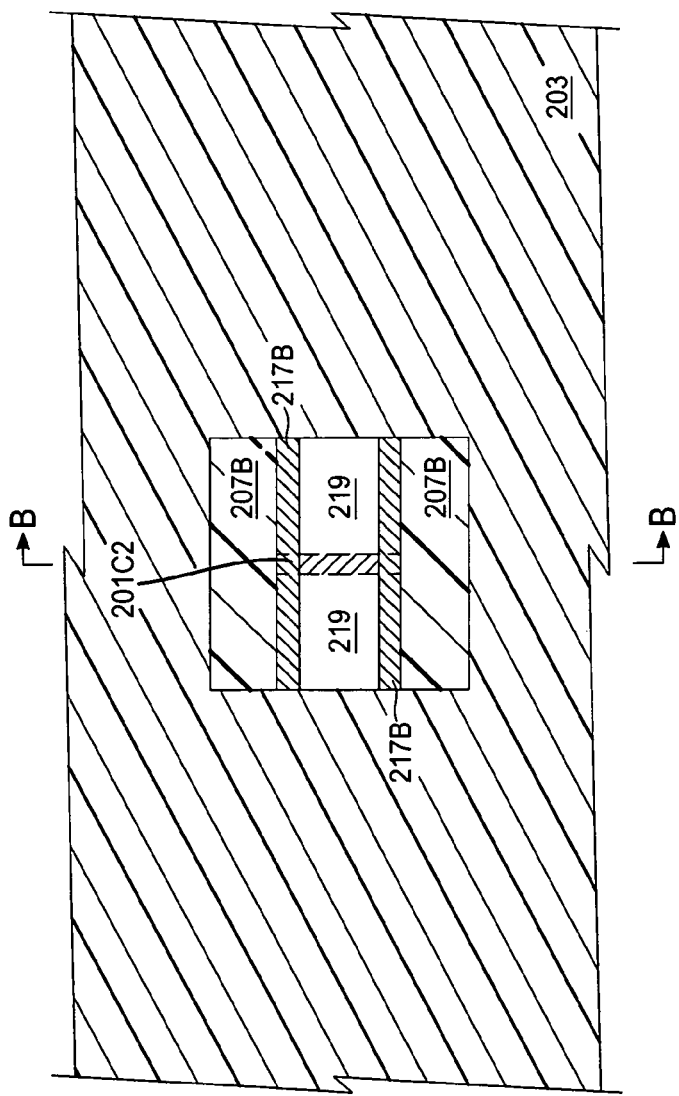
Fig. _ 2K

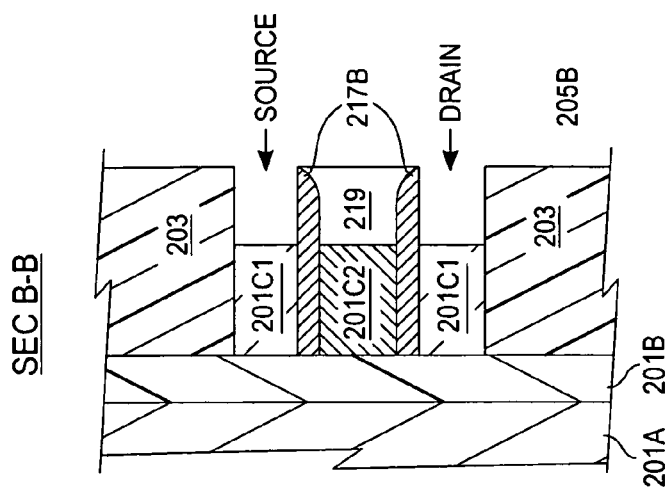
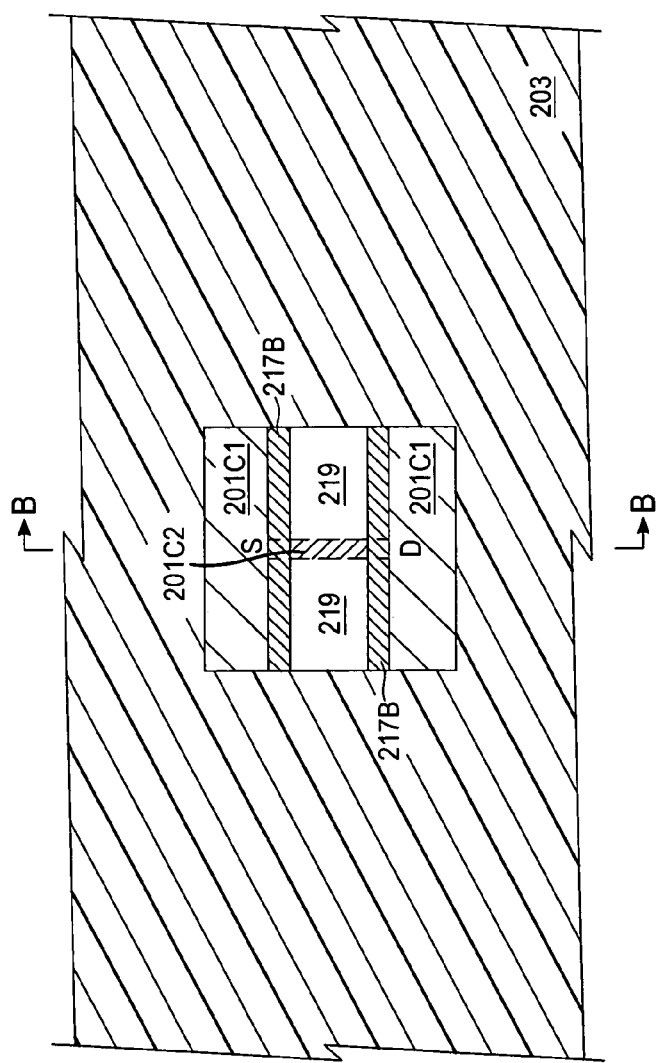
Fig. _ 2L

SELF-ALIGNED NANOMETER-LEVEL TRANSISTOR DEFINED WITHOUT LITHOGRAPHY

TECHNICAL FIELD

The present invention relates generally to FET and MOSFET transistors, and more particularly the invention relates to field effect transistors having channel regions extending vertically from a supporting substrate between horizontally disposed source and drain regions.

BACKGROUND ART

Metal-oxide-semiconductor field effect transistor (MOSFET) technology is a dominant electronic device technology in use today. Performance enhancement between generations of devices is generally achieved by reducing an overall size of the device, resulting in an enhancement in device speed. This size reduction is generally referred to as device scaling. As MOSFETs are scaled to channel lengths below about 100 nm, conventional MOSFETs suffer from several problems. In particular, interactions between the source and drain of the MOSFET degrade an ability of the gate to control whether the device is on or off. The degradation in control ability phenomenon is called a short-channel effect (SCE). Silicon-on-insulator (SOI) MOSFETs are formed with an insulator (usually, but not limited to, silicon dioxide or sapphire) below an active region of the device, unlike conventional bulk MOSFETs, which are formed directly on silicon substrates, and hence have silicon below all active regions. SOI is generally considered advantageous as it reduces unwanted coupling between the source and the drain of the MOSFET through the region below the channel. Other techniques, such as separation by implantation of oxygen (SIMOX) functions similarly to SOI. The reduction in coupling in SOI and SIMOX is often achieved by ensuring that all the silicon in the MOSFET channel region can be either inverted or depleted by the gate (called a fully depleted MOSFET). As device size is scaled, however, ensuring a fully depleted channel region becomes increasingly difficult, since the distance between the source and drain is reduced. The reduced distance results in an increased interaction with the channel thus reducing gate control and increasing short channel effects.

A double-gate MOSFET structure places a second gate in the device, such that there is a gate on either side of the channel. The double-gate allows gate control of the channel from both sides, reducing SCE. Additionally, when the device is turned on using both gates, two conduction (i.e., inversion) layers are formed, allowing for better channel control. An extension of the double-gate concept is a surround-gate or wraparound-gate concept, where the gate is placed such that it completely or almost-completely surrounds the channel, providing improved gate control. These surround-gate and wraparound-gate concepts are also formed on SOI or SIMOX and are referred to as FinFET devices due to the silicon-etched fin produced above the oxide/insulator level.

Such a FinFET device is presented in U.S. Pat. No. 6,413,802, entitled "FinFET Transistor Structures Having a Double Gate Channel Extending Vertically from a Substrate and Methods of Manufacture," issued to Hu et al. FIG. 1 illustrates a FinFET transistor 100 in accordance with Hu et al. The FinFET transistor 100 is fabricated on an insulative layer 101 (e.g., SIMOX) and includes a silicon drain island 103 and a silicon source island 105 connected by a silicon fin or channel 107. The drain island 10, source island 105, and channel 107 are each covered by a dielectric layer 109, and a gate 111 extends across the channel 107 and is isolated from the channel 107 by a gate oxide (not shown explicitly) and the dielectric layer 109. Inversion layers are formed on either side of the channel 107. However, the FinFET transistor 100 still relies on photolithography for minimum feature sizes (e.g., a width of the channel 107 and the gate 111).

There is a need in the integrated circuit art for obtaining increasingly smaller devices without sacrificing device performance. The small device size requires small device regions, precise and accurate alignment between regions, and minimization of parasitic resistances and capacitances. Device size can be reduced by putting more reliance on fine line lithography, but as discussed below, it becomes impractical or impossible to continue to reduce feature size and achieve the required greater increase in alignment accuracy. As lithography is pushed to a limit, yield and production throughput decrease.

Four governing performance parameters of a photolithographic system are limit-of-resolution, $L_r$, level-to-level alignment accuracy, depth-of-focus, and throughput. For purposes of this discussion, limit-of-resolution, level-to-level alignment, and depth-of-focus are physically constrained parameters.

Typical photolithographic techniques are limited by physical constraints of a photolithographic system involving actinic radiation wavelength, $\lambda$, and geometrical configurations of projection system optics. According to Rayleigh's criterion, $$L_r = \frac{0.61\lambda}{NA}$$

where NA is the numerical aperture of the optical system and is defined as NA $=n \sin \alpha$, where n is the index of refraction of a medium which the radiation traverses (usually air for this application, so n$\approx$1) and $\alpha$ is a half-angle of the divergence of the actinic radiation. For example, using deep ultraviolet illumination (DUV) with $\lambda$=193 nm, and NA=0.7, the lower limit of resolution is 168 nanometers (1680 Å). Techniques such as phase-shifted masks can extend this limit downward, but photomasks required in this technique are extremely expensive. This expense becomes greatly compounded with a realization that an advanced semiconductor process may employ more than 25 photomasks.

Along with the limit-of-resolution, the second parameter, level-to-level alignment accuracy becomes more critical as feature sizes on photomasks decrease and a number of total photomasks increases. For example, if photomask alignment by itself causes a reduction in device yield to 95% per layer, then 25 layers of photomask translates to a total device yield of $0.95^{25}$=0.28 or 28% yield (assuming independent errors). Therefore, a more complicated mask, such a phase-shifted mask is not only more expensive but device yield can suffer dramatically.

Further, although the numerical aperture of the photolithographic system may be increased to lower the limit-of-resolution, the third parameter, depth-of-focus, will suffer as a result. Depth-of-focus is inversely proportional to NA$^2$. Therefore, as NA increases, limit-of-resolution decreases but depth-of-focus decreases more rapidly. The reduced depth-of-focus makes accurate focusing more difficult especially on non-planar features such as "Manhattan Geometries" becoming increasingly popular in advanced semiconductor devices.

Therefore, what is needed is a method of forming a FinFET device with minimum design geometries substantially smaller than achievable with photolithography. Further, the FinFET device must be fabricated by a process that is reproducible and fully adaptable to high-volume semiconductor fabrication processes.

SUMMARY

An SOI transistor is fabricated by a highly modified FinFET technology. The FinFET implementation disclosed utilizes design rules far smaller than may be achieved through conventional lithography by fabricating nitride spacers to define device geometries on underlying semiconducting layers. Lateral device geometries relate to a thickness, rather than a width, of a deposited dielectric layer.

In an exemplary embodiment, a method for forming a highly modified FinFET transistor includes providing a substrate having a base, an insulative layer, and a semiconducting layer and forming a pedestal region from the semiconducting layer. The pedestal region is surrounded with a first dielectric layer where an uppermost surface of the first dielectric layer is substantially coplanar with an uppermost surface of the pedestal region. A second dielectric material is then formed over a first uppermost portion of the pedestal region leaving an exposed uppermost portion of the pedestal region not covered by the second dielectric material. A third dielectric material is formed conformally over the second dielectric material and the exposed portion of the pedestal region. Horizontal regions of the third dielectric material are etched, leaving a first dielectric spacer where the first dielectric spacer overlies a protected portion of the pedestal region. Substantially all portions of the second dielectric material are then removed followed by removing substantially all portions of the pedestal region that are not laterally in close proximity to or underlying the protected portion, thereby forming a fin. The fin is doped with a dopant having a first type of majority carrier and the doped fin thus forms a channel region of the transistor. Transistor gate, drain, and source are then formed in association with the channel region to complete the device.

In another exemplary embodiment, a highly modified FinFET transistor includes a fin fabricated from a first portion of a first semiconducting layer where the semiconducting layer overlies an insulating layer (e.g., SOI or SIMOX). A minimum lateral dimension of the fin is related to a thickness of a dielectric formed over the fin and used to form a dielectric spacer rather than relying on a limit of resolution of a particular photolithographic tool. A gate region comprised of a second semiconducting material overlies the fin, the fin being doped with a majority carrier of a first type. A drain region is formed on a second portion of the semiconducting material adjacent to the fin, the drain region being located on a first side of the gate region, the drain region being doped with a majority carrier of a second type. A source region is formed on a second portion of the semiconducting material adjacent to the fin, the source region being distal to the drain region and located on a second side of the gate region, the source region being doped with the majority carrier of the second type.

BRIEF DESCRIPTION OF THE DRAWINGS

FIG. 1 is a perspective view of a FinFET device of the prior art.

FIGS. 2A-2L show various stages in an exemplary process flow for producing a self-aligned nanometer-level transistor.

DETAILED DESCRIPTION

With reference to FIG. 2A, a substrate 201A has a insulative layer 201B, and an unetched semiconductor layer 201C1. In a specific exemplary embodiment the substrate 201A, the insulative layer 201B, and the (unetched) semiconductor layer 201C1 is a commonly available combination material—a silicon-on-insulator (SOI) wafer. Another combination material incorporating the aforementioned three layers is a wafer produced as a separation by implantation of oxygen (SIMOX). However, a skilled artisan will recognize that other appropriate materials for the substrate 201A or the (unetched) semiconductor layer 201C1 materials include, for example, elemental semiconductors such as germanium, compound semiconductors such as group III-V, and II-VI materials, and semiconducting alloys. Additionally, the substrate 201A may be comprised of a non-semiconducting material such as, for example, a photomask blank or reticle. The term "substrate," as used herein, may thus be interpreted to be either a base, such as the substrate 201A, or a combination material including a base, an insulative layer, and a semiconductor layer.

The etched semiconductor layer 201C is patterned and etched to produce the pedestal shape shown in FIG. 2A by techniques known to a person of skill in the art. For example, after appropriate masking, if the (unetched) semiconductor layer 201C1 is comprised of silicon, silicon may be etched with, for example, dry-etch techniques. Once the etched semiconductor layer 201C1 has been formed, a fill oxide 203, a pad oxide 205A, and a first nitride layer 207 A are added to and around the etched semiconductor layer 203C1. The fill oxide 203 may be, for example, a high-density plasma (HDP) generated silicon dioxide film or an oxide produced by various other chemical vapor deposition (CVD) techniques. The pad oxide 205A may be, for example, thermally grown or produced by CVD techniques. The nitride layer 207A may also be produced by CVD techniques comprising silicon nitride deposition techniques. In a specific exemplary embodiment, the pad oxide 205A is 50 Å-200 Å in thickness, the first nitride layer 207A is 500 Å-1500 Å in thickness, and a total height of the fill oxide 203 is dependent on a thickness of the (unetched) semiconductor layer 201C2. The nitride layer 207A will be used as "Hard" mask. If the starting material used is SOI, the height of the etched semiconductor layer 203C1 is about 0.20 μm-1.0 μm. Although exact fabrication procedures and sequences for producing the fill oxide 203, the pad oxide 205A, or the first nitride layer 207A are not given herein, such fabrication procedures are readily known to a person of ordinary skill in the art.

Figure 2B:
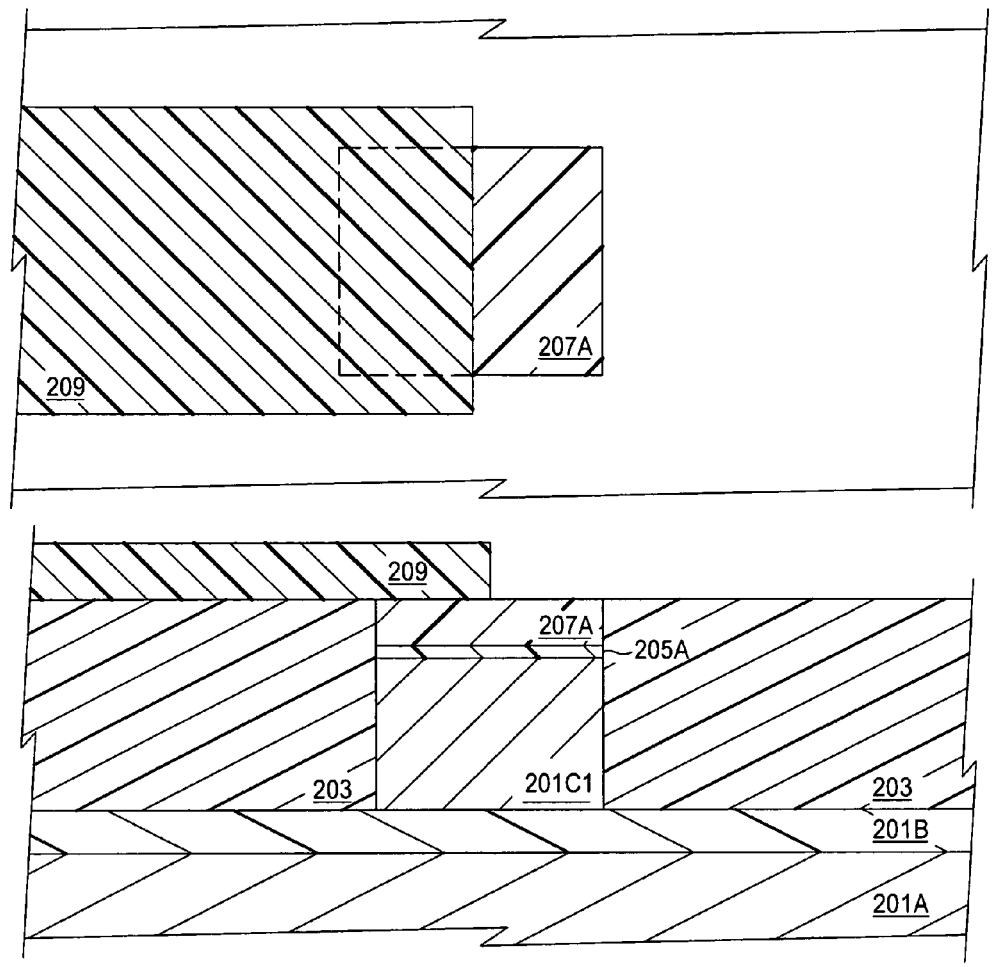
Figure 2C:
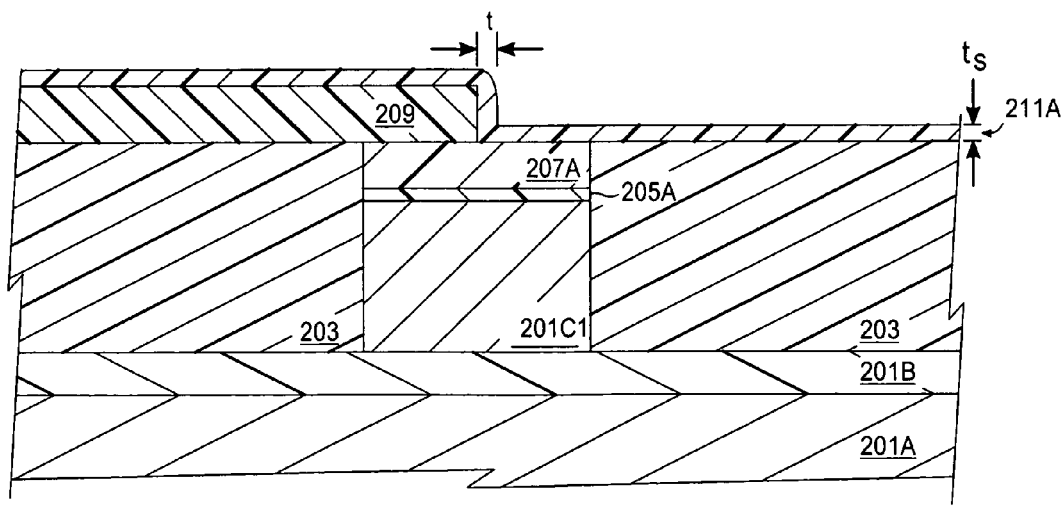

With reference to FIG. 2B, a first mask layer 209 is deposited and patterned, partially overlapping an uppermost section of the first nitride layer 207A. The first mask layer 209 may be, for example, tetra-ethoxysilane (TEOS) deposited to a thickness of about 1000 Å-3000 Å. A second nitride layer 211A (FIG. 2C) is then conformally deposited over the first mask layer 209. A thickness, $t_s$, of the second nitride layer 211A is typically less than 2000 Å. The thickness, $t_s$, defines a thickness of an eventual semiconductor fin produced (discussed infra). Consequently, an actual thickness, $t_s$, of the second nitride layer 211A is less important than the fabrication techniques described herein so long as the thickness, $t_s$, is chosen to closely match an expected thickness of the fin produced.

Figure 2D:
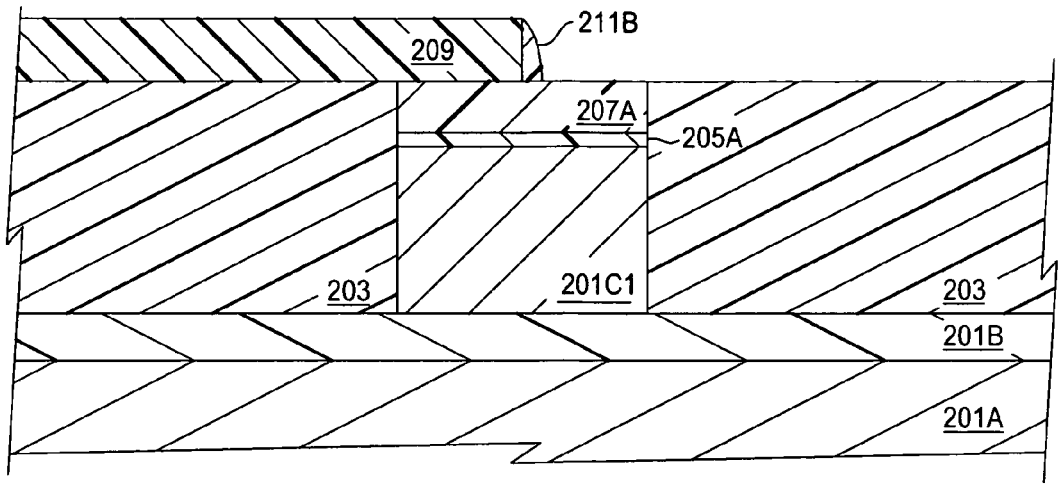
Figure 2E:
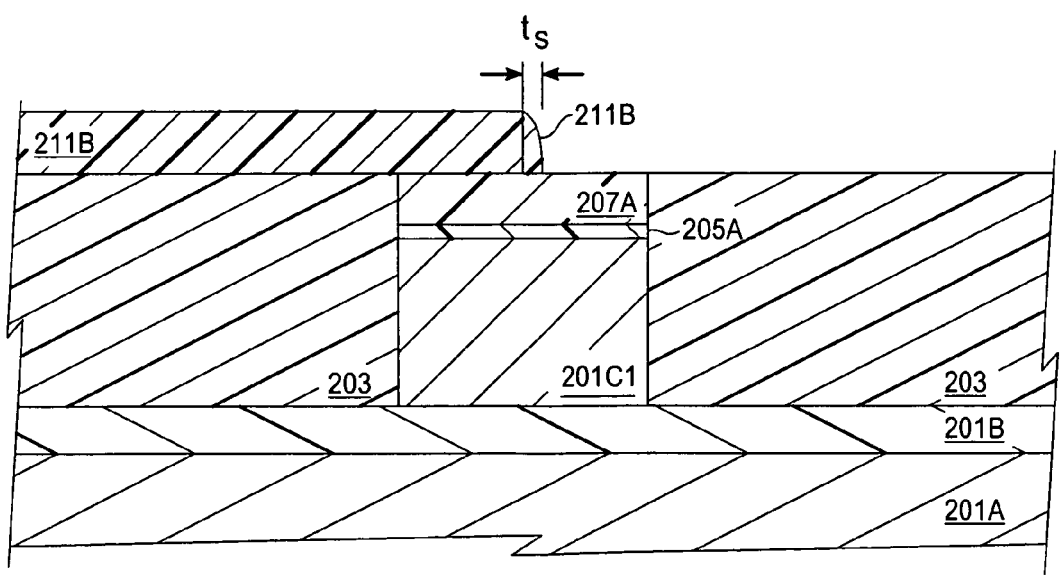

A dry-etch (e.g., a reactive-ion etch (RIE)) optimized to remove primarily horizontal portions of the second nitride layer 211A produces a nitride spacer 211B (FIG. 2D). The first mask layer 209 is then removed (FIG. 2E) by etching in accordance with methods known in the semiconductor arts. For example, depending upon a chemical composition of a given layer, etching may be accomplished through various wet etch (e.g., in hydrofluoric acid, such as contained in a standard buffered oxide etch, or orthophosphoric acid) or dry-etch techniques (e.g., RIE).

FIG. 2F provides a multi-view indication of a relationship between the nitride spacer 211B and other features in the fabrication process such as the first nitride layer 207A. The plan view of FIG. 2F shows that the nitride spacer 211B is actually a square ring that once surrounded the now-etched first mask layer 209. Section A-A of FIG. 2F indicates only that portion of the nitride spacer 211B that will be used to form the etched semiconductor fin (described infra). An area underlying the nitride layer 207A will eventually become the active area of the transistor. Section B-B indicates portions of the nitride spacer 211B lying outside of the active area, the active area being confined primarily to an area within the fill oxide 203.

Figure 2G:
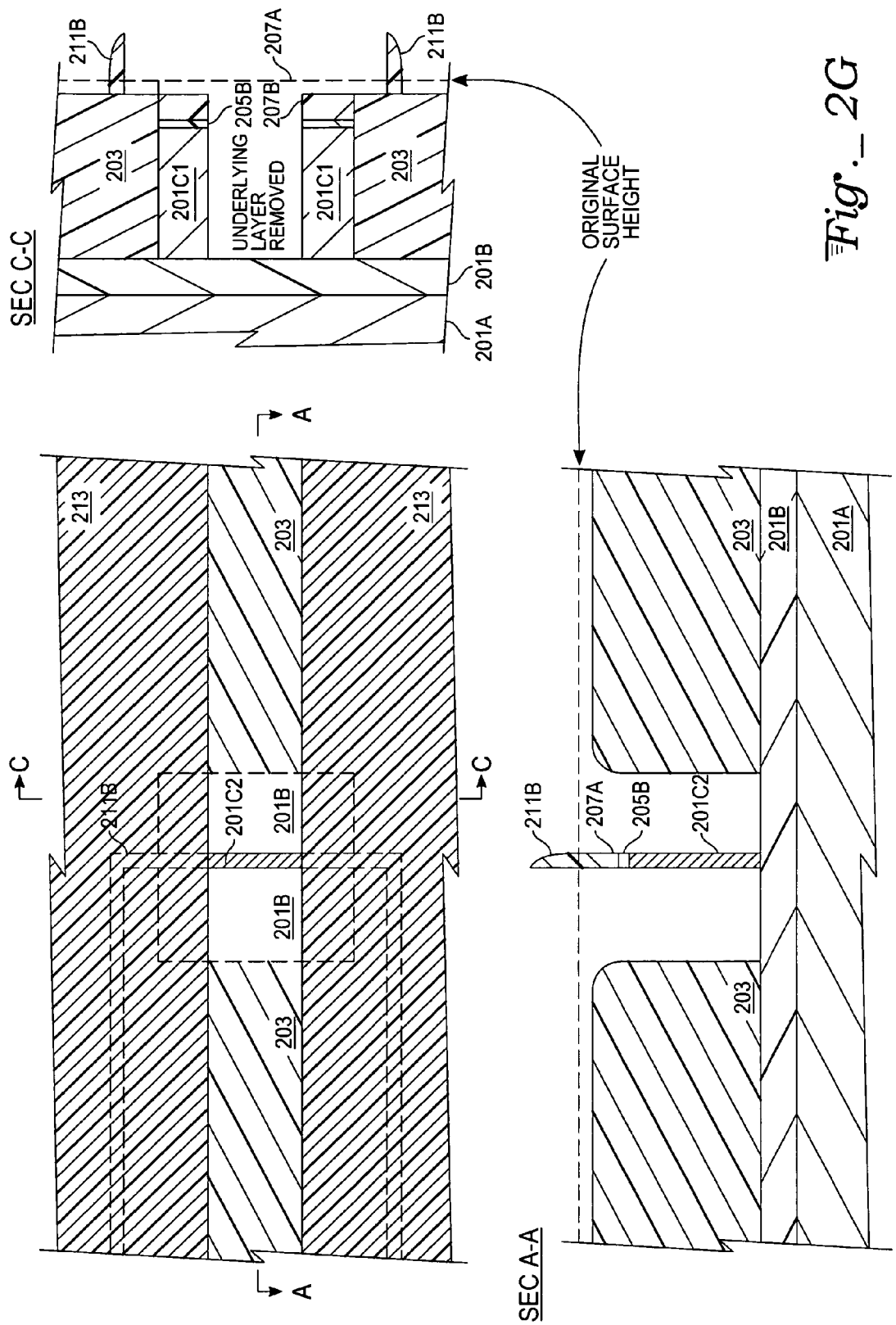

With reference to FIG. 2G, a photoresist mask layer 213 is applied over the fill oxide 203, the first nitride layer 207A, and the nitride spacer 211B. The photoresist mask layer 213 is then patterned forming an open channel over portions of both the fill oxide 203 and the active area. The open channel area allows an etchant to remove underlying layers of material in the active area (Section C-C, FIG. 2G). A highly selective dry etch (e.g., RIE) may be used to remove the underlying layers within the channel. The nitride spacer 211B serves as a hard mask to the underlying etched semiconductor layer 201C1 thus allowing an etched semiconductor fin ("fin") 201C2 to be formed (Section A-A). Portions of the etched semiconductor layer 201C1 remain in the active area bounded by the fill oxide 203. These portions will later form source and drain regions, discussed infra. Notice that an original surface height of the fill oxide 203 may also be lowered due to aggressive etching required to clear the underlying layers down to an uppermost portion of the insulative layer 201B. The insulative layer 201B acts as an etch-stop; thus, timing issues are eliminated.

In addition to selectively etching and forming the fin 201C2 through dry-etch techniques, a skilled artisan will recognize that other etch techniques may be employed as well. In FIG. 2H, the photoresist mask layer 213 (FIG. 2G) has been stripped. The nitride spacer 211B and the etched first nitride layer 207B have also been removed with, for example, a high-selectivity etchant (e.g., wet-etched). The high-selectivity etchant may be optimized to remove silicon nitride while having little if any effect on silicon or silicon dioxide. A cross-sectional view of the fin 201C2 is presented in Section A-A while Section B-B indicates a transverse slice through the fin 201C2 and a relationship of the fin to remaining portions of the etched semiconductor layer 201C1 which will become source and drain regions of a FET transistor.

Figure 2I:
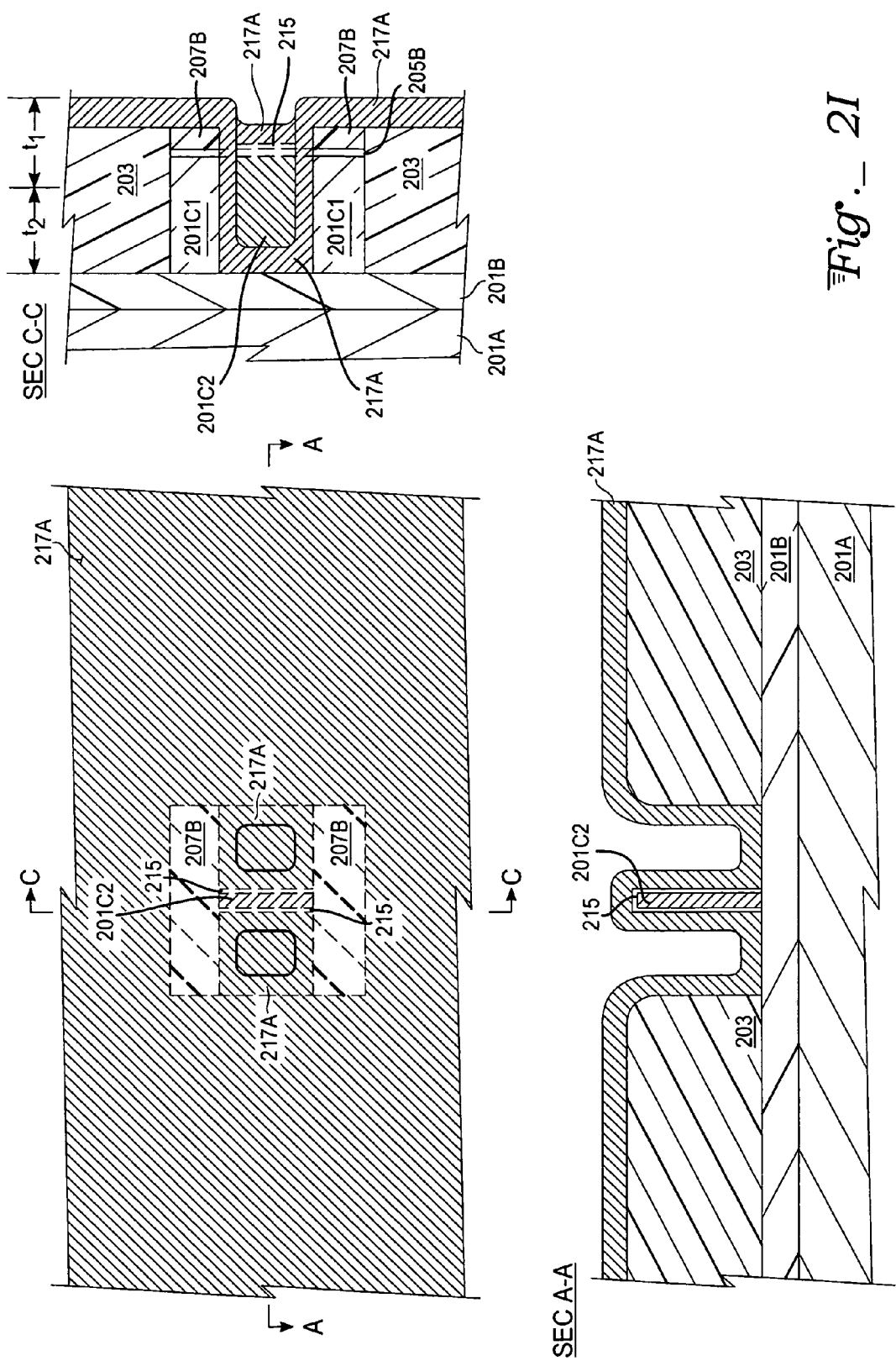

With reference to FIG. 2I, the etched pad oxide 205B has been stripped from the fin 201C2 and a sacrificial oxide 215 has been formed over the fin 201C2. If the fin 201C2 is comprised of any material subject to oxidation (e.g., silicon), the sacrificial oxide 215 may be thermally grown. This oxidation repairs any surface damage of the fin 201C2 after, for example, a dry-etch step. An oxide spacer layer 217A is then conformally formed (e.g., deposited) over the fin 201C2 and surrounding areas. The plan view of FIG. 2I provides an illustration of how the conformally deposited oxide spacer layer 217A produces open areas on either side of the fin 201C2. Additionally, the oxide spacer 217A surrounds the fin 201C2 (as indicated in Sections A-A and C-C). Relative thicknesses $t_s$, and $t_2$ of various parts of the film stack are chosen such that a thickness of $t_s$, is greater than a thickness of $t_2$. (FIG. 2I should be viewed in a relative and not an absolute sense. Therefore, as is the case with all patent figures, FIG. 2I is not necessarily to scale. Therefore, it is to be understood that $t_1$, is thicker than $t_2$.

In FIG. 2J, the oxide spacer layer 217A is etched anisotropically primarily etching the oxide spacer layer 217A from sidewalls of the fin 201C2, leaving etched oxide spacers 217B of sides of the active area. Lateral dimensions in two directions on a fabricated device may be made extremely small through a use of spacers as described herein. This two-dimensional size reduction is due both to a small size of the nitride spacer 211B (FIG. 2G) as well as a minimum width between the oxide spacers 217B. Consequently, the fin 201C2 can theoretically possess lateral dimensions of 30 Å in each direction (i.e., x-y) or less.

A preoxidation clean is performed to fully clean sidewalls of the fin 201C2 prior to forming a gate oxide (not shown) over the fin 201C2. A dopant may be added to the fin 201C2 as well, forming a channel region of the FinFET transistor. A polysilicon layer 219 is then conformally applied (FIG. 2K). A planarization step is performed, planarizing a top portion of the polysilicon layer 219 to be substantially coplanar with uppermost portions of the fill oxide 203 and the etched first nitride layer 207B. The planarization may be accomplished by, for example, a chemical mechanical planarization (CMP) system and process, using the uppermost portion of the etched first nitride layer 207B as an etch stop.

With reference to FIG. 2L, an etching process (either dry-etch or wet-etch) is used to remove the remaining portions of the etched first nitride layer 207B and the etched pad oxide layer 205B remaining above each portion of the etched semiconductor layer 201C1 in the active area (i.e., the area bounded laterally by the fill oxide 203. Standard transistor fabrication techniques are then employed to produce final features required for the FinFET transistor device, such as doping regions of the etched semiconductor layer 201C1 thus producing source and drain regions as indicated.

In the foregoing specification, the present invention has been described with reference to specific embodiments thereof. It will, however, be evident to a skilled artisan that various modifications and changes can be made thereto without departing from the broader spirit and scope of the invention as set forth in the appended claims. For example, skilled artisans will appreciate that although specific layers are called out, such as oxide and nitride, other films (e.g., other dielectric films) with similar etch characteristics (e.g., high etch-selectivity differences) could be readily employed as well. Further, the exemplary embodiments called out specific techniques and specific processes for making a FinFET transistor. Similar techniques may be employed to produce other device types as well or a series of mixed device types. As defined and fabricated herein, adjacent devices require no additional barrier layers to isolate the devices (such as, for example, shallow trench isolation (STI) regions) since the fill oxide layer 203 surrounding each device may be employed as a barrier layer. Therefore, the specification and drawings are, accordingly, to be regarded in an illustrative rather than a restrictive sense.

What is claimed is:

1. A method for forming a fin for use in an electronic device, the method comprising:
providing a substrate having a base, an insulative layer, and a semiconducting layer;
forming a pedestal region including the semiconducting layer;
surrounding the pedestal region with a first dielectric layer, an uppermost surface of the first dielectric layer being substantially coplanar with an uppermost surface of the pedestal region,
forming a second dielectric material over a first uppermost portion of the pedestal region leaving an exposed uppermost portion of the pedestal region not covered by the second dielectric material;
forming a third dielectric material conformally over the second dielectric material and the exposed portion of the pedestal region;
etching regions of the third dielectric material that are substantially parallel to a face of the substrate thereby leaving a first dielectric spacer, the first dielectric spacer overlying a protected portion of the pedestal region;
substantially removing the second dielectric material; and
etching substantially all portions of the pedestal region that are not laterally in close proximity to or underlying the protected portion, thereby forming a fin.

2. The method of claim 1 further comprising:
forming a fourth dielectric layer conformally over the fin and first dielectric layer;
etching regions of the fourth dielectric material that are substantially parallel to a face of the substrate thereby leaving a set of second dielectric spacers, each of the set of second dielectric spacers substantially covering an exposed sidewall of the first dielectric layer; and
filling an opening proximate to the fin with polysilicon.

3. The method of claim 2 wherein the polysilicon is planarized to a level substantially coplanar with the uppermost surface of the first dielectric layer.

4. The method of claim 1 wherein the substrate is comprised of a silicon-on-insulator (SOI) material.

5. The method of claim 1 wherein the substrate is comprised of a SIMOX material.

6. The method of claim 1 further comprising:
doping the fin with a dopant having a first type of majority carrier; and
doping remaining portions of the pedestal region distal to the protected portion with a dopant having a second type of majority carrier.

7. The method of claim 1 further comprising selecting a material for the second dielectric layer and a material for the third dielectric layer to have dissimilar etching characteristics.

8. A method for forming a transistor, the method comprising:
providing a substrate having a base, an insulative layer, and a semiconducting layer;
forming a pedestal region including the semiconducting layer;
surrounding the pedestal region with a first dielectric layer, an uppermost surface of the first dielectric layer being substantially coplanar with an uppermost surface of the pedestal region;
forming a second dielectric material over a first uppermost portion of the pedestal region leaving an exposed uppermost portion of the pedestal region not covered by the second dielectric material;
forming a third dielectric material conformally over the second dielectric material and the exposed portion of the pedestal region;
etching regions of the third dielectric material that are substantially parallel to a face of the substrate thereby leaving a first dielectric spacer, the first dielectric spacer overlying a protected portion of the pedestal region;
substantially removing the second dielectric material;
etching substantially all portions of the pedestal region that are laterally not in close proximity to or underlying the protected portion, thereby forming a fin; and
doping the fin with a dopant having a first type of majority carrier, the doped fin forming a channel region of the transistor.

9. The method of claim 8 further comprising:
forming a fourth dielectric layer conformally over the fin and first dielectric layer;
etching regions of the fourth dielectric material that are substantially parallel to a face of the substrate thereby leaving a set of second dielectric spacers, each of the set of second dielectric spacers substantially covering an exposed sidewall of the first dielectric layer; and
filling an opening proximate to the fin with polysilicon.

10. The method of claim 9 wherein the polysilicon is planarized to a level substantially coplanar with the uppermost surface of the first dielectric layer.

11. The method of claim 8 wherein the substrate is comprised of a silicon-on-insulator (SOI) material.

12. The method of claim 8 wherein the substrate is comprised of a SIMOX material.

13. The method of claim 8 further comprising doping remaining portions of the pedestal region distal to the protected portion with a dopant having a second type of majority carrier, the remaining portions of the pedestal region forming drain and source regions for the transistor.

14. The method of claim 8 further comprising selecting a material for the second dielectric layer and a material for the third dielectric layer to have dissimilar etching characteristics.

15. The method of claim 8 wherein the semiconducting layer is chosen to have a (100) lattice orientation.

16. The method of claim 8 wherein the semiconducting layer is chosen to have a particular lattice orientation.

17. The method of claim 8 wherein the width of the fin is formed to be as small as 30 Å.

* * * * *

UNITED STATES PATENT AND TRADEMARK OFFICE
CERTIFICATE OF CORRECTION

PATENT NO. : 7,341,916 B2  Page 1 of 1
APPLICATION NO. : 11/271094
DATED : March 11, 2008
INVENTOR(S) : Lojek It is certified that error appears in the above-identified patent and that said Letters Patent is hereby corrected as shown below:

In column 4, line 38, delete "207 A" and insert -- 207A --, therefor.

In column 5, line 31, delete "211B ." and insert -- 211B. --, therefor.

In column 5, lines 52-63, after "well." delete "In FIG. 2H, the photoresist mask layer 213 (FIG. 2G) has been stripped. The nitride spacer 211B and the etched first nitride layer 207B have also been removed with, for example, a high-selectivity etchant (e.g., wet-etched). The high-selectivity etchant may be optimized to remove silicon nitride while having little if any effect on silicon or silicon dioxide. A cross-sectional view of the fin 201C2 is presented in Section A-A while Section B-B indicates a transverse slice through the fin 201C2 and a relationship of the fin to remaining portions of the etched semiconductor layer 201C1 which will become source and drain regions of a FET transistor." and insert the same on Col. 5, Line 53, as a new paragraph.

In column 6, line 10, delete "$t_s$," and insert -- $t_1$ --, therefor.

In column 6, line 11, delete "$t_s$," and insert -- $t_1$ --, therefor.

Signed and Sealed this

Seventh Day of October, 2008

JON W. DUDAS
*Director of the United States Patent and Trademark Office*